(12) United States Patent
Chen et al.

(10) Patent No.: US 11,728,338 B2
(45) Date of Patent: Aug. 15, 2023

(54) SEAL STRUCTURES

(71) Applicant: Taiwan Semiconductor Manufacturing Company, Ltd., Hsinchu (TW)

(72) Inventors: Chun Yu Chen, Hsinchu (TW); Yen Lian Lai, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 110 days.

(21) Appl. No.: 17/465,556

(22) Filed: Sep. 2, 2021

(65) Prior Publication Data

US 2023/0009803 A1 Jan. 12, 2023

Related U.S. Application Data

(60) Provisional application No. 63/220,112, filed on Jul. 9, 2021.

(51) Int. Cl.
*H01L 27/088* (2006.01)
*H01L 23/00* (2006.01)
*H01L 23/58* (2006.01)

(52) U.S. Cl.
CPC .......... *H01L 27/088* (2013.01); *H01L 23/562* (2013.01); *H01L 23/585* (2013.01)

(58) Field of Classification Search
CPC .... H01L 27/088; H01L 23/562; H01L 23/585
USPC ......................................................... 257/401
See application file for complete search history.

(56) References Cited

U.S. PATENT DOCUMENTS

| 10,727,218 | B2 | 7/2020 | Wu et al. | |
| 2010/0207250 | A1* | 8/2010 | Su | H01L 23/585 |
| | | | | 257/E23.179 |
| 2014/0167043 | A1* | 6/2014 | Zundel | H01L 23/585 |
| | | | | 438/597 |
| 2015/0364463 | A1* | 12/2015 | Suzuki | H01L 27/0255 |
| | | | | 257/355 |
| 2018/0294259 | A1* | 10/2018 | Sato | H01L 29/0834 |
| 2023/0028005 | A1* | 1/2023 | Chen | H01L 23/10 |
| 2023/0029241 | A1* | 1/2023 | Chen | H01L 23/562 |
| 2023/0030448 | A1* | 2/2023 | Lai | H01L 23/562 |
| 2023/0043166 | A1* | 2/2023 | Lai | H01L 23/585 |

* cited by examiner

*Primary Examiner* — Dao H Nguyen
(74) *Attorney, Agent, or Firm* — Haynes and Boone, LLP

(57) ABSTRACT

Integrated circuit (IC) chips and seal ring structures are provided. An IC chip according to the present disclosure includes a device region, an inner ring surrounding the device region, an outer ring surrounding the inner ring, a first corner area between an outer corner of the inner ring and an inner corner of the outer ring, and a second corner area disposed at an outer corner of the outer ring. The first corner area includes a first active region including a channel region and a source/drain region, a first gate structure over the channel region of the first active region, and a first source/drain contact over the source/drain region of the first active region. The first source/drain contact continuously extends from a first edge of the first corner area to a second edge of the first corner area.

20 Claims, 13 Drawing Sheets

US 11,728,338 B2

SEAL STRUCTURES

PRIORITY DATA

This application claims priority to U.S. Provisional Patent Application Ser. No. 63/220,112, filed Jul. 9, 2021, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

Due to the scaling down, the structures of the FinFETs or MBC transistors may be susceptible to damages due to mist ingress or stress during singulation. Seal structures have been implemented to protect semiconductor devices. While existing seal structures are generally satisfactory for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
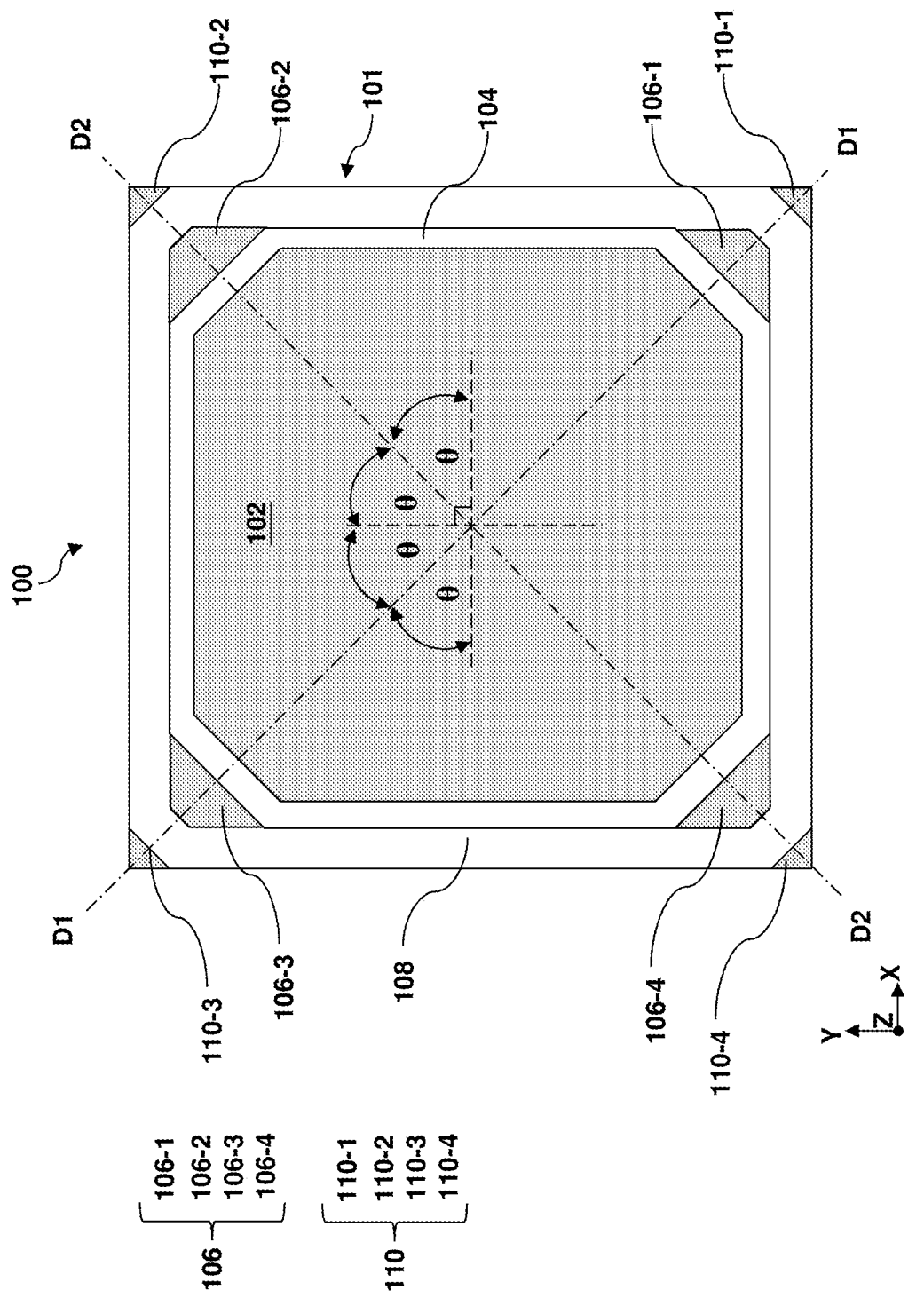
FIG. 1 illustrates a top view of an integrated circuit (IC) chip, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed. For avoidance of doubts, the X, Y and Z directions in figures of the present disclosure are perpendicular to one another. Throughout the present disclosure, like reference numerals denote like features, unless otherwise excepted.

Seal structures are used to prevent semiconductor devices in an integrated circuit (IC) chip from being damaged due to mist ingress or stress during singulation of the IC chip. Multi-gate devices, such as FinFETs and MBC transistors, emerge as the industry moves toward smaller device nodes. While FinFETs and MBC transistors improve gate control and short channel effects, they are not immune from damages from water and stress. In fact, due to their delicate dimensions and structures, they may be more prone to damages without adequate seal structures. In some existing technologies, features in the seal structures, such as source/drain contacts, may be intentionally segmented to control the pattern density. When the pattern density in the seal structures exceed a predetermined level, a subsequent planarization process may overly reduce heights of the seal structures, rendering them less effective. However, when the features in the seal structures are intentionally segmented, the seal structures may not function at their best. This dilemma presents challenges in designing and manufacturing seal structures.

The present disclosure provides embodiments an IC chip that includes seal structures. According to embodiments of the present disclosure, the IC chip includes a device region, an inner ring surrounding the device region, an outer ring surrounding the inner ring, an inner corner area between an outer corner of the inner ring and an inner corner of the outer ring, and an outer corner area disposed at an outer corner of the outer ring. The inner corner area includes an active region including a channel region and a source/drain region, a gate structure over the channel region of the active region, and a source/drain contact over the source/drain region of the active region. The source/drain contact continuously extends from a first edge of the inner corner area to a second edge of the inner corner area. The pattern density in the device region is high enough to match the pattern density in the inner corner area. The seal structures of the present disclosure are configured to protect the semiconductor devices in the IC chip from water and stress.

Reference is first made to FIG. 1, which is a top view of an integrated circuit (IC) chip 100. The IC chip 100 includes a device region 102, an inner ring 104 continuously surrounding the device region 102, an outer ring 108 continuously surrounding the inner ring 104, four inner corner areas 106 disposed between outer corners of the inner ring 104 and the inner corners of the outer ring 108, four outer corner areas 110 disposed at outer corners of the outer ring 108. The inner corner areas 106 includes a first inner corner area 106-1, a second inner corner area 106-2, a third inner corner area 106-3, and a fourth inner corner area 106-4. For ease of reference, the first inner corner area 106-1, the second inner corner area 106-2, the third inner corner area 106-3, and the fourth inner corner area 106-4 may be collectively or respectively referred to as inner corner areas 106 or an inner corner area 106 as the context requires. The outer corner area 110 includes a first outer corner area 110-1, a second outer corner area 110-2, a third outer corner area 110-3, and a fourth corner area 110-4. For ease of reference, the first outer corner area 110-1, the second outer corner area 110-2, the third outer corner area 110-3, and the fourth outer corner area 110-4 may be collectively or respectively referred to as outer corner areas 110 or an outer corner area 110 as the context requires. The IC chip 100 may be rectangular in shape when viewed along the Z direction. In some instances as shown in FIG. 1, the IC chip 100 is square in shape in the top view. In these embodiments, each of the inner corner areas 106 resembles a right triangle that has the right-angle vertex clipped off and each of the outer corner areas 110 is a right triangle.

In the embodiments represented in FIG. 1, the IC chip 100 includes a first diagonal line D1 and a second diagonal line D2. The first diagonal line D1 extends from the first outer corner area 110-1, through the outer ring 108, the first inner corner area 106-1, the inner ring 104, and the device region 102, the inner ring 104, the third inner corner area 106-3, the outer ring 108, to the third outer corner area 110-3. The first diagonal line D1 and the X direction form an angle θ. The first diagonal line D1 and the Y direction also form the angle θ. The second diagonal line D2 extends from the second outer corner area 110-2, through the outer ring 108, the second inner corner area 106-2, the inner ring 104, and the device region 102, the inner ring 104, the fourth inner corner area 106-4, the outer ring 108, to the fourth outer corner area 110-4. The second diagonal line D2 and the X direction form the angle θ. The second diagonal line D2 and the Y direction also form the angle θ. The angle θ is 45 degrees (45°). In the depicted embodiments, the first diagonal line D1 and the second diagonal line D2 are perpendicular to one another. As shown in FIG. 1, the device region 102 has an octagon shape. Each of the first inner corner area 106-1, the second inner corner area 106-2, the third corner area 106-3, and the fourth inner corner area 106-4 has an edge that is parallel to one edge/side of the device region 102.

The IC chip 100 may be fabricated on a substrate 101. In some embodiments, the substrate 101 may be a bulk silicon (Si) substrate. Alternatively, substrate 101 may include elementary semiconductor, such as germanium (Ge); a compound semiconductor, such as silicon carbide (SiC), gallium arsenide (GaAs), gallium phosphide (GaP), indium phosphide (InP), indium arsenide (InAs), and/or indium antimonide (InSb); an alloy semiconductor, such as silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); or combinations thereof. In some implementations, the substrate 101 includes one or more group III-V materials, one or more group II-VI materials, or combinations thereof. In still some instances, the substrate 101 is a semiconductor-on-insulator substrate, such as a silicon-on-insulator (SOI) substrate, a silicon germanium-on-insulator (SGOI) substrate, or a germanium-on-insulator (GeOI) substrate. In still some embodiments, the substrate 101 may be diamond substrate or a sapphire substrate.

Figure 2:
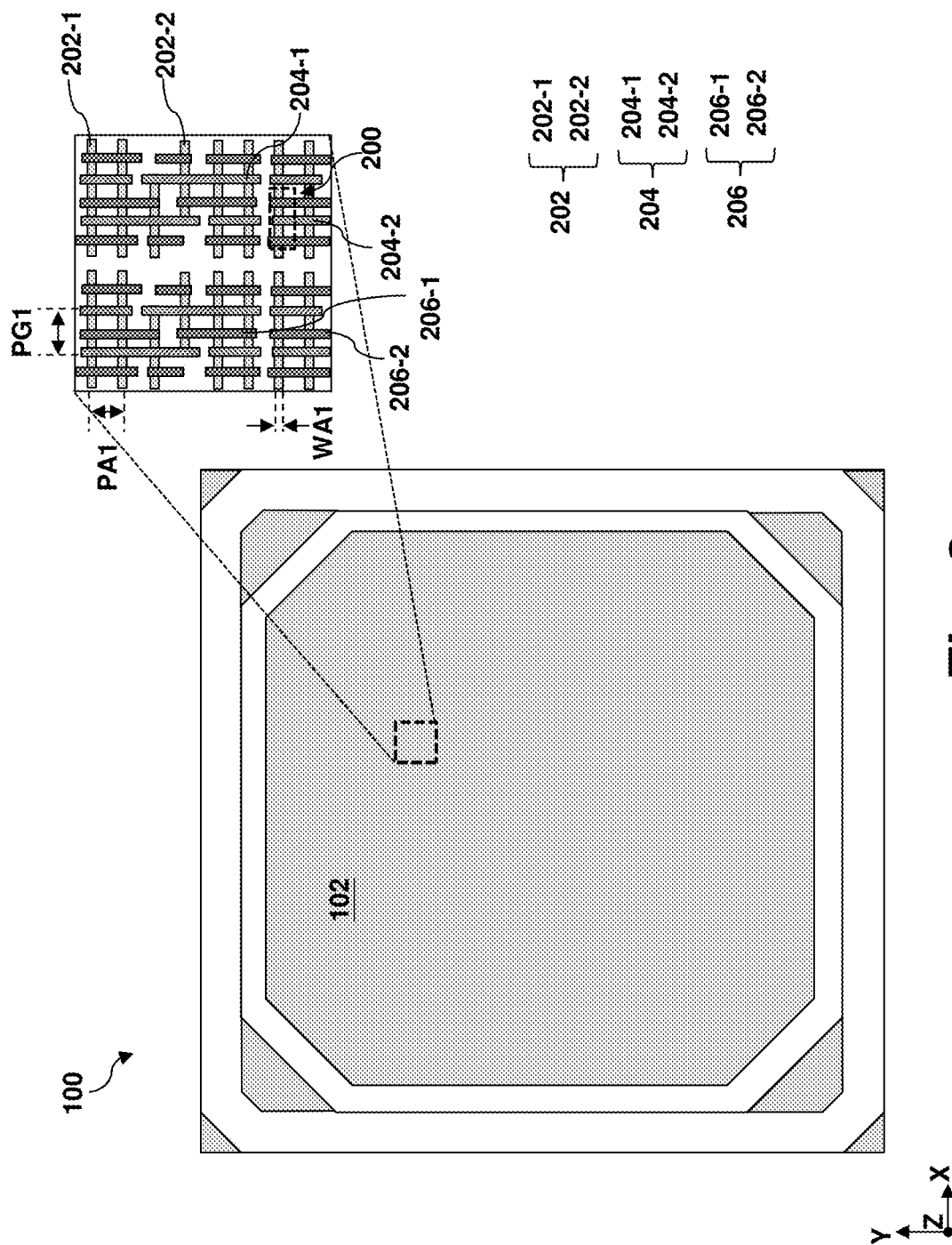
FIG. 2 illustrates an enlarged fragmentary top view of a device region of the IC chip in FIG. 1, according to one or more aspects of the present disclosure.

FIG. 2 includes an enlarged fragmentary top view of the device region 102. The device region 102 may include logic devices, memory devices, and input/output (I/O) devices. The logic devices may include, for example, inverters, AND gates, OR gates, NAND gates, NOR gates, XNOR gates, XOR gates, and NOT gates. The memory devices may include static random access memory (SRAM) devices. In some embodiments represented in FIG. 2, the device region 102 includes segmented active regions 202 extending along the X direction, segmented gate structures 204 extending along the Y direction, and segmented source/drain contacts 206 extending along the Y direction. The segmented active regions 202, the segmented gate structures 204, and the segmented source/drain contacts 206 are segmented such that the device region 102 performs the functions it intends to. If the segmented active regions 202, the segmented gate structures 204, and the segmented source/drain contacts 206 are not segmented as representatively shown in FIG. 2 and are allowed to extend continuously throughout the X direction and Y direction, the device region 102 would not be able to perform its intended function. For example, when the segmented gate structures 204 are not segmented, they will control all transistors disposed along the Y direction. For another example, when the segmented source/drain contacts 206 are not segmented, they will connect all source/drain features disposed along the Y direction in parallel. Put differently, the segmented active regions 202 do not extend continuously across the device region 102 along the X direction; the segmented gate structures 204 do not extend continuously across the device region 102 along the Y direction; and the segmented source/drain contacts 206 do not extend continuously across the device region 102 along the Y direction.

The segmented active regions 202 may have different lengths. In the depicted embodiments, the segmented active regions 202 include a first segmented active region 202-1 and a second segmented active region 202-2. The first segmented active region 202-1 has a length greater than a length of the second segmented active region 202-2. The segmented gate structures 204 include a first segmented gate structure 204-1 and a second segmented gate structure 204-2. The first segmented gate structure 204-1 has a length greater than a length of the second segmented gate structure 204-2. In FIG. 2, the first segmented gate structure 204-1 is disposed over four (4) segmented active regions 202 and the second segmented gate structure 204-2 is disposed over two (2) segmented active regions 202. The segmented source/drain contacts 206 include a first segmented source/drain contact 206-1 and a second segmented sourced/drain contact 206-2. The first segmented source/drain contact 206-1 has a length greater than a length of the second segmented source/drain contact 206-2. In FIG. 2, the first segmented source/drain contact 206-1 connects source/drain features over three segmented active regions 202 and the second segmented source/drain contact 206-2 connects source/drain features over two segmented active regions 202.

The segmented active regions 202 may include silicon (Si) or a suitable semiconductor material. Each of the segmented gate structures 204 includes a gate dielectric layer and a gate electrode layer over the gate dielectric layer.

In some embodiments, while not explicitly shown in the figures, the gate dielectric layer includes an interfacial layer and a high-K gate dielectric layer. High-K dielectric materials, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer may include hafnium oxide. Alternatively, the high-K gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. The high-K gate dielectric layer may be formed by ALD, physical vapor deposition (PVD), CVD, oxidation, and/or other suitable methods.

The gate electrode layer of the segmented gate structures 204 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process.

Each of the segmented sourced/drain contacts 206 may include a barrier layer, a silicide layer, and a metal filler layer disposed over the silicide layer. The barrier layer may include titanium nitride or tantalum nitride. The silicide layer may include titanium silicide, tantalum silicide, cobalt silicide, nickel silicide, or tungsten silicide. The silicide layer interfaces the source/drain features to reduce contact resistance. The source/drain features are formed by epitaxial deposition of semiconductor materials such as silicon or silicon germanium and may be doped with an n-type dopant, such as phosphorus (P) or arsenic (As) or a p-type dopant, such as boron (B) or boron difluoride ($BF_2$). The metal fill layer may include ruthenium (Ru), copper (Cu), nickel (Ni), cobalt (Co), or tungsten (W).

Reference is still made to FIG. 2. The segmented active regions 202, although having different lengths along the X direction, are disposed at a first active region pitch PA1 along the Y direction. The segmented gate structures 204, although having different lengths along the Y direction, are disposed at a first gate pitch PG1 along the X direction. In some embodiments, the first active region pitch PA1 may be between about 50 nm and about 120 nm and the first gate pitch PG1 may be between about 40 nm and about 65 nm. Each of the segmented active regions 202 has a first active region width WA1. In some instances, the first active region width WA1 may be between about 10 nm and about 60 nm.

Figure 3:
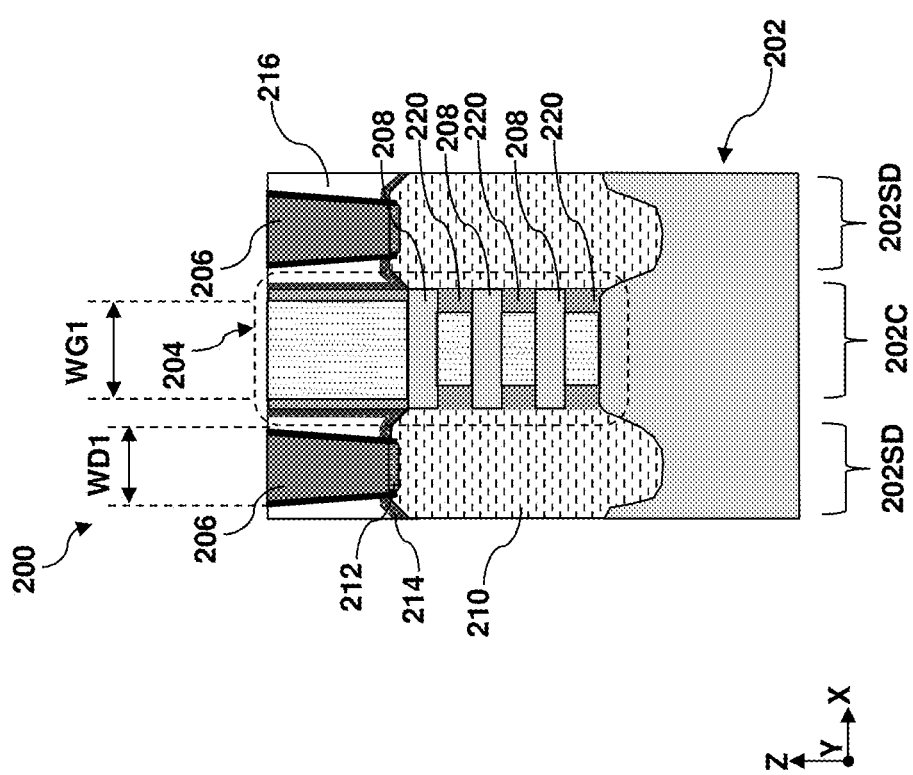
FIG. 3 illustrates a fragmentary cross-sectional view of a semiconductor device in the device region of the IC chip in FIG. 1, according to one or more aspects of the present disclosure.

Reference is now made to FIG. 3, which illustrates a fragmentary cross-sectional view of a first semiconductor device 200 in the device region 102. In the depicted embodiment, the first semiconductor device 200 is an MBC transistor. Each of the segmented active regions 202 includes a channel region 202C disposed between two source/drain regions 202SD. In the channel region 202C, the segmented active region 202 includes a vertical stack of channel members 208 that extend along the X direction. The channel members 208 extend between two source/drain features 210, each of which is disposed over a source/drain region 202SD. As described above, the source/drain features 210 may include silicon (Si) doped with an n-type dopant or silicon germanium (SiGe) doped with a p-type dopant. The channel members 208 may be referred to as nanostructures due to their nano-scale dimensions. In some instances, the channel members 208 may be referred to nanosheets when their width is greater than their thickness. In some other instances, the channel members 208 may be referred to as nanowires when their width is substantially similar to their thickness. A segmented gate structure 204 is disposed over the channel region 202C to wrap around each of the channel members 208. As shown in the FIG. 3, the segmented gate structure 204 is spaced apart from the source/drain features 210 by inner spacer features 220. The channel members 208 over the channel region 202C are vertically separated from one another by the inner spacer features 220.

A contact etch stop layer (CESL) 214 is disposed over the source/drain features 210 and an interlayer dielectric (ILD) layer 216 over the CESL 214. A source/drain contact 206 extends through the CESL 214 and the ILD layer 216 to come in contact with the source/drain feature 210. In some examples, the CESL 214 includes silicon nitride, silicon oxynitride, and/or other materials known in the art. The ILD layer 216 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The source/drain contacts 206 extend through the ILD layer 216 and the CESL 214 to electrically couple to the source/drain features 210 by way of the silicide layer 212. As shown in FIG. 3, the segmented source/drain contact 206 has a first contact width WD1 along the X direction and the segmented gate structure 204 has a first gate width WG1 along the X direction. In some instances, the first contact width WD1 is between about 15 nm and about 25 nm and the first gate width WG1 is between about 20 nm and about 30 nm. The inner spacer features 220 may include silicon nitride, silicon oxynitride, silicon carbonitride, or silicon oxycarbonitride.

Figure 4:
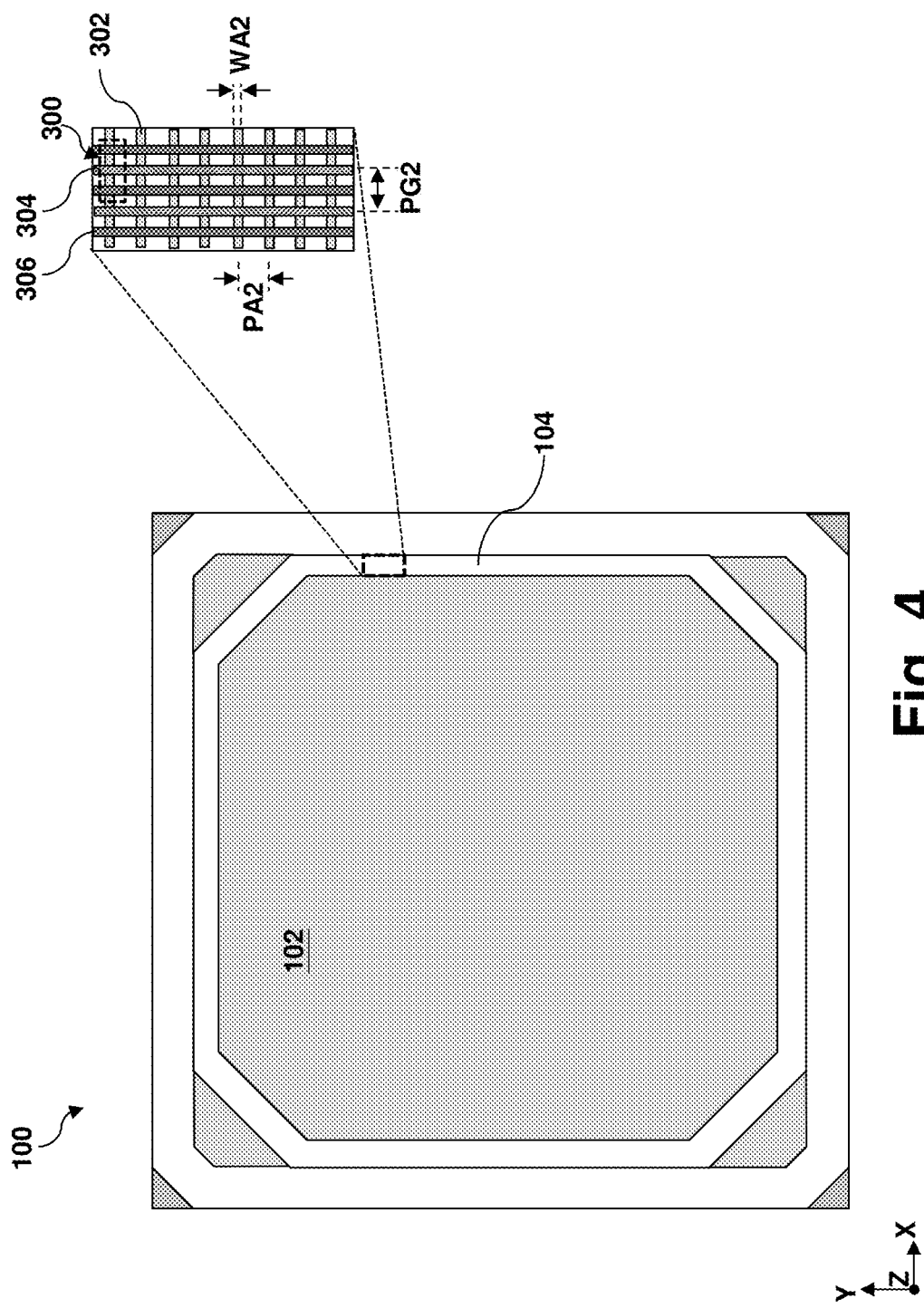
FIG. 4 illustrates an enlarged fragmentary top view of an inner ring of the IC chip in FIG. 1, according to one or more aspects of the present disclosure.

Reference is then made to FIG. 4, which includes an enlarged fragmentary top view of the inner ring 104. The inner ring 104 may include an array or a string of second semiconductor devices 300. In some embodiments, the second semiconductor devices 300 in the inner ring 104 serve as grounding structures. That is, the second semiconductor devices 300 in the inner ring 104 do not function as transistors. In the embodiments represented in FIG. 4, the inner ring 104 includes first active regions 302 extending perpendicular to a length of the inner ring 104, first gate structures 304 continuously extending along the length of the inner ring 104, first source/drain contacts 306 continuously extending along the length of the inner ring 104. As shown in FIG. 4, each of the first gate structures 304 and each of the first source/drain contacts 306 may extend over all the first active regions 302 in the inner ring 104. The first gate structures 304 and the first source/drain contacts 306 resemble walls around a castle, with the device region 102 resembling the castle.

The first active regions 302 may include silicon (Si) or a suitable semiconductor material. Each of the first gate structures 304 includes a gate dielectric layer and a gate electrode layer over the gate dielectric layer. While being different in shape and configuration, the first gate structures 304 and the segmented gate structures 204 have similar composition and are formed using the same processes. Therefore, a detailed description of the composition of the first gate structures 304 is omitted for brevity.

Each of the first sourced/drain contacts 306 may include a barrier layer, a silicide layer, and a metal filler layer disposed over the silicide layer. The barrier layer may include titanium nitride or tantalum nitride. The silicide layer may include titanium silicide, tantalum silicide, cobalt silicide, nickel silicide, or tungsten silicide. The silicide layer interfaces the source/drain features to reduce contact resistance. The metal fill layer may include ruthenium (Ru), copper (Cu), nickel (Ni), cobalt (Co), or tungsten (W). The source/drain features are formed by epitaxial deposition of semiconductor materials such as silicon or silicon germanium and may be doped with an n-type dopant, such as phosphorus (P) or arsenic (As) or a p-type dopant, such as boron (B) or boron difluoride ($BF_2$).

Reference is still made to FIG. 4. The first active regions 302 are disposed at a second active region pitch PA2 along the length of the inner ring 104. In the enlarged portion shown in FIG. 4, the first active regions 302 are arranged one-by-one along the Y direction because the enlarged portion is along an edge of the inner ring 104 that extends along the Y direction. The first gate structures 304 are disposed at a second gate pitch PG2 along a direction perpendicular to the length of the inner ring 104. That is, each of the first gate structures 304 goes completely around the device region 102. Each of the first source/drain contacts 306 also goes completely around the device region 102 In some embodiments, the second active region pitch PA2 may be between about 100 nm and about 200 nm and the second gate pitch PG2 may be between about 40 nm and about 100 nm. Each of the first active regions 302 has a second active region width WA2. In some instances, the second active region width WA2 may be between about 30 nm and about 80 nm.

Figure 5:
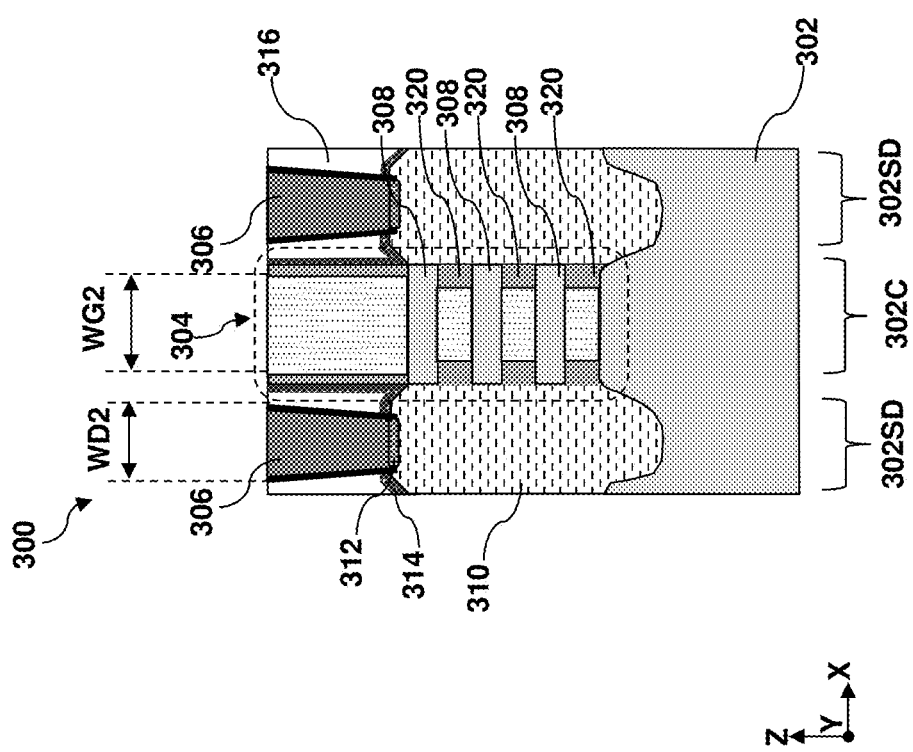
FIG. 5 illustrates a fragmentary cross-sectional view of a semiconductor device in the inner ring of the IC chip in FIG. 1, according to one or more aspects of the present disclosure.

Reference is now made to FIG. 5, which illustrates a fragmentary cross-sectional view of the second semiconductor device 300 in the inner ring 104. In the depicted embodiment, the second semiconductor device 300 is an MBC transistor. Each of the first active regions 302 includes a channel region 302C disposed between two source/drain regions 302SD. In the channel region 302C, the first active region 302 includes a vertical stack of channel members 308 that extend along the X direction. The channel members 308 extend between two source/drain features 310, each of which is disposed over a source/drain region 302SD. As described above, the source/drain features 310 may include silicon (Si) doped with an n-type dopant or silicon germanium (SiGe) doped with a p-type dopant. The channel members 308 may be referred to as nanostructures due to their nano-scale dimensions. In some instances, the channel members 308 may be referred to nanosheets when their width is greater than their thickness. In some other instances, the channel members 308 may be referred to as nanowires when their width is substantially similar to their thickness. A first gate structure 304 is disposed over the channel region 302C to wrap around each of the channel members 308. As shown in the FIG. 5, the first gate structure 304 is spaced apart from the source/drain features 310 by inner spacer features 320. The channel members 308 over the channel region 302C are vertically separated from one another by the inner spacer features 320.

A contact etch stop layer (CESL) 314 is disposed over the source/drain features 310 and an interlayer dielectric (ILD) layer 316 over the CESL 314. A first source/drain contact 306 extends through the CESL 314 and the ILD layer 316 to come in contact with the source/drain feature 310. In some examples, the CESL 314 includes silicon nitride, silicon oxynitride, and/or other materials known in the art. The ILD layer 316 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The first source/drain contacts 306 extend through the ILD layer 316 and the CESL 314 to electrically couple to the source/drain features 310 by way of the silicide layer 312. As shown in FIG. 5, the first source/drain contact 306 has a second contact width WD2 along the X direction and the first gate structure 304 has a second gate width WG2 along the X direction. In some instances, the second contact width WD2 is between about 15 nm and about 50 nm and the second gate width WG2 is between about 20 nm and about 50 nm. The inner spacer features 320 may include silicon nitride, silicon oxynitride, silicon carbonitride, or silicon oxycarbonitride.

The second semiconductor device 300 in the inner ring 104 is much larger than the first semiconductor devices 200 in the device region 102. For example, dimensions of the second semiconductor device 300 are about 5 times to about 15 times of those of the first semiconductor device 200. For example, a ratio of the second gate pitch PG2 to the first gate pitch PG1 is between about 5 and about 15; a ratio of the second active region pitch PA2 to the first active region pitch PA1 is between about 5 and about 15; a ratio of the second active region width WA2 to the first active region width WA1 is between about 5 and about 15; a ratio of the second contact width WD2 to the first contact width WD1 is between about 5 and about 15; and a ratio of the second gate width WG2 to the first gate width WG1 is between about 5 and about 15.

Figure 6:
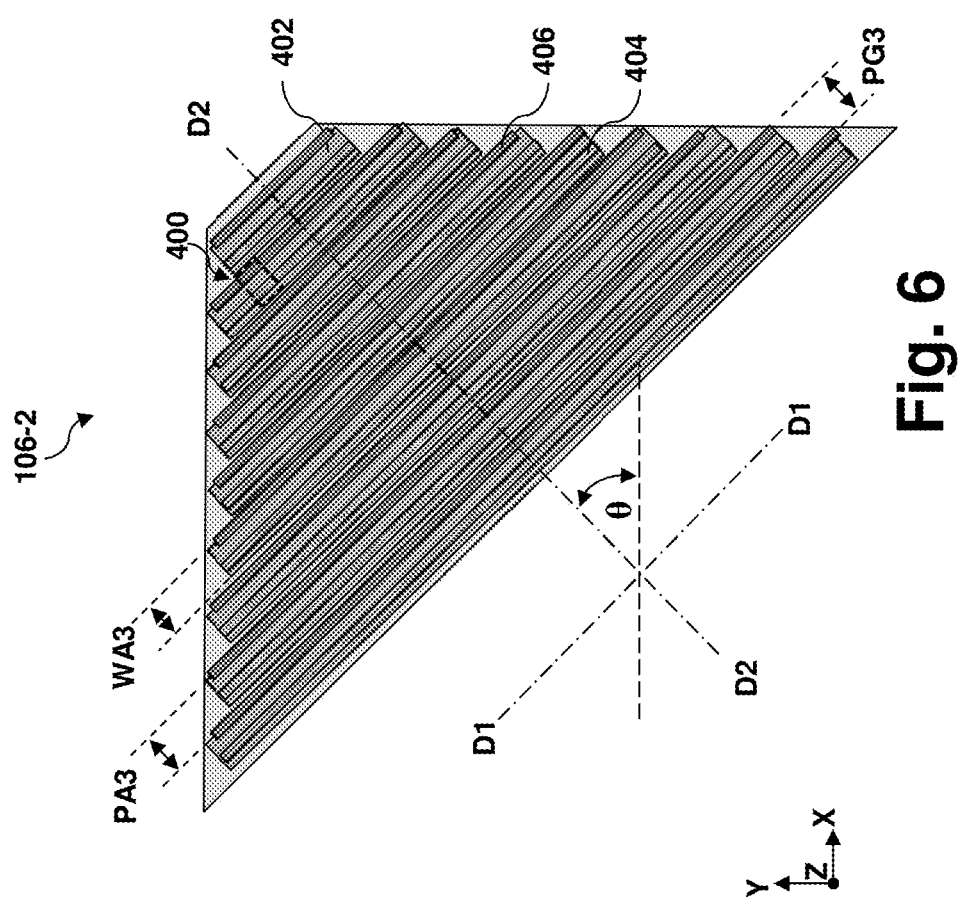
FIG. 6 illustrates an enlarged fragmentary top view of an inner corner area of the IC chip in FIG. 1, according to one or more aspects of the present disclosure.

Reference is then made to FIG. 6, which includes an enlarged fragmentary top view of an inner corner area 106. For illustration purposes, the second inner corner area 106-2 is shown in FIG. 6 but similar descriptions apply to the other three inner corner areas 106-1, 106-3 and 106-4. The second inner corner area 106-2 may include an array of third semiconductor devices 400. In some embodiments, the third semiconductor devices 400 in the inner corner areas 106 are electrically floating and serve as seal structures. That is, the third semiconductor devices 400 in the inner corner areas 106 function neither as transistors nor as grounding structures. In the embodiments represented in FIG. 6, the second inner corner area 106-2 includes second active regions 402 extending along the first diagonal line D1 (which is perpendicular the second diagonal line D2), second gate structures 404 extending continuously along the first diagonal line D1, second source/drain contacts 406 continuously extending along the first diagonal line D1. That is, the second active regions 402, the second gate structures 404, and the second source/drain contacts 406 are parallel to one another. As shown in FIG. 6, the second active regions 402, the second gate structures 404 and the second source/drain contacts 406 extend substantially and continuously from one edge of the second inner corner area 106-2 to the other edge.

The second active regions 402 may include silicon (Si), germanium (Ge), silicon germanium (SiGe) or a combination thereof. When MBC transistors are desired for the device region 102, the segmented active regions 202 include channel members 208 that are released by selective removal of silicon germanium sacrificial layers. As will be described further below, because the second gate structures do not span completely across the second active region 402, both the silicon layers and the silicon germanium layers remain in the second active region 402. Each of the second gate structures 404 includes a gate dielectric layer and a gate electrode layer over the gate dielectric layer. While being different in shape and configuration, the second gate structures 404 and the segmented gate structures 204 have similar composition and are formed using the same processes. Therefore, a detailed description of the composition of the second gate structures 404 is omitted for brevity.

Each of the second sourced/drain contacts 406 may include a barrier layer, a silicide layer, and a metal filler layer disposed over the silicide layer. The barrier layer may include titanium nitride or tantalum nitride. The silicide layer may include titanium silicide, tantalum silicide, cobalt silicide, nickel silicide, or tungsten silicide. The silicide layer interfaces the source/drain features to reduce contact resistance. The metal fill layer may include ruthenium (Ru), copper (Cu), nickel (Ni), cobalt (Co), or tungsten (W). The source/drain features are formed by epitaxial deposition of semiconductor materials such as silicon (Si) or silicon germanium (SiGe) and may be doped with an n-type dopant, such as phosphorus (P) or arsenic (As) or a p-type dopant, such as boron (B) or boron difluoride ($BF_2$).

Reference is still made to FIG. 6. The second active regions 402 are disposed at a third active region pitch PA3 along the second diagonal line D2. The second gate structures 404 are disposed at a third gate pitch PG3 along the second diagonal line D2. Each of the second gate structures 404 extends continuously from one edge of the second inner corner area 106-2 to another edge. Each of the second source/drain contacts 406 also extends continuously from one edge of the second inner corner area 106-2 to another edge. In some embodiments, the third active region pitch PA3 may be between about 125 nm and about 400 nm and the third gate pitch PG3 may be between about 125 nm and about 400 nm. Each of the second active regions 402 has a third active region width WA3. In some instances, the third active region width WA3 may be between about 50 nm and about 300 nm.

Figure 7:
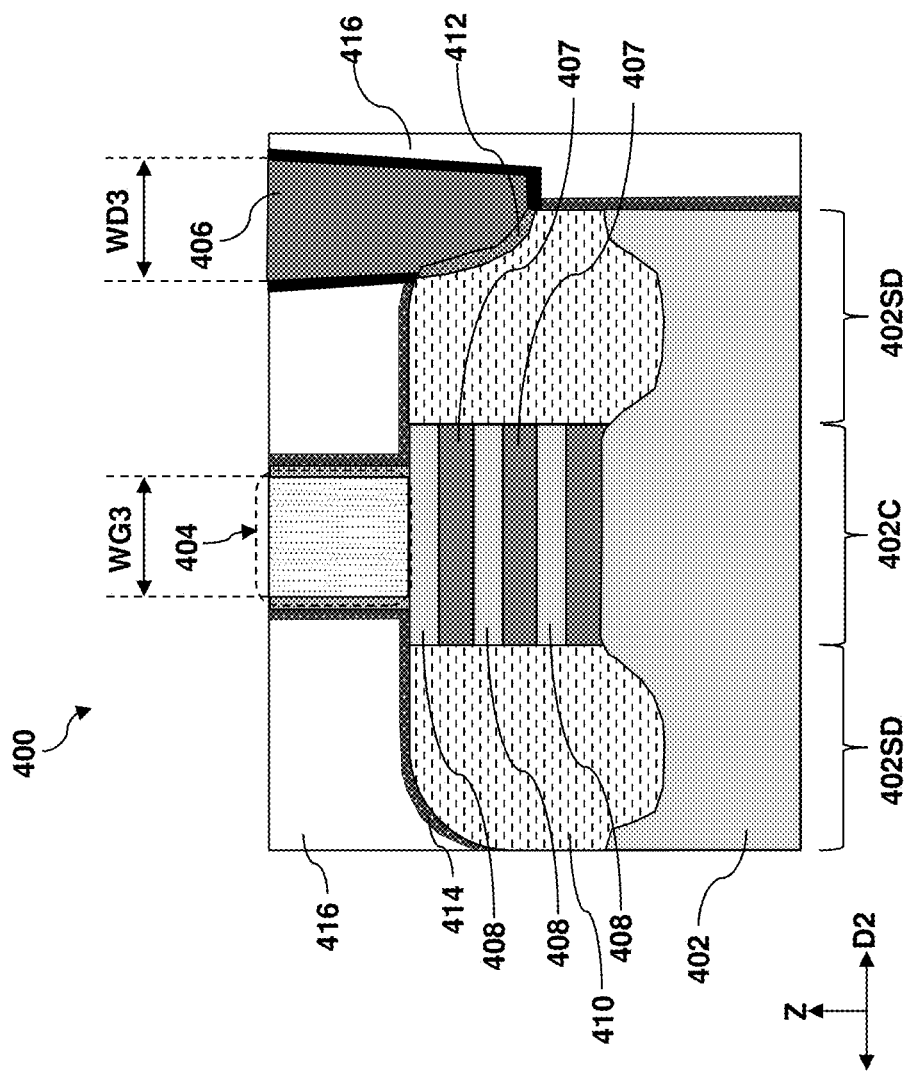
FIG. 7 illustrates a fragmentary cross-sectional view of a semiconductor device in the inner corner area of the IC chip in FIG. 1, according to one or more aspects of the present disclosure.

Reference is now made to FIG. 7, which illustrates a fragmentary cross-sectional view of the third semiconductor device 400 in the second inner corner area 106-2. In the depicted embodiment, the third semiconductor device 400 includes some feature of an MBC transistor but is structurally more similar to a FinFET. Each of the second active regions 402 includes a channel region 402C disposed between two source/drain regions 402SD. In the channel region 402C, the second active region 402 includes a vertical stack of channel layers 408 that are interleaved by sacrificial layers 407. In some instances, the channel layers 408 include silicon and the sacrificial layers 407 include silicon germanium. Along the second diagonal line D2, the channel layers 408 and sacrificial layers 407 extend between two source/drain features 410, each of which is disposed over a source/ drain region 402SD. As described above, the source/drain features 410 may include silicon (Si) doped with an n-type dopant or silicon germanium (SiGe) doped with a p-type dopant. A second gate structure 404 is disposed over the channel region 402C but does not wrap around each of the channel layers 408 as the sacrificial layers 407 are not removed.

A contact etch stop layer (CESL) 414 is disposed over the source/drain features 410 and an interlayer dielectric (ILD) layer 416 over the CESL 414. A second source/drain contact 406 extends through the CESL 414 and the ILD layer 416 to come in contact with the source/drain feature 410. In some examples, the CESL 414 includes silicon nitride, silicon oxynitride, and/or other materials known in the art. The ILD layer 416 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The second source/drain contacts 406 extend through the ILD layer 416 and the CESL 414 to electrically couple to the source/drain features 410 by way of the silicide layer 412. As shown in FIG. 7, the second source/drain contact 406 has a third contact width WD3 along the second diagonal line D2 and the second gate structure 404 has a third gate width WG3 along the second diagonal line D2. In some instances, the third contact width WD3 is between about 30 nm and about 100 nm and the third gate width WG3 is between about 50 nm and about 150 nm. In the depicted embodiments, the second source/drain contact 406 is disposed directly over an edge of the second active region 402 to maximize the spacing between the second source/drain contact 406 and the second gate structure 404.

The third semiconductor device 400 in the second inner corner area 106-2 is much larger than the first semiconductor devices 200 in the device region 102. For example, dimensions of the third semiconductor device 400 are about 5 times to about 15 times of those of the first semiconductor device 200. For example, a ratio of the third gate pitch PG3 to the first gate pitch PG1 is between about 5 and about 15; a ratio of the third active region pitch PA3 to the first active region pitch PA1 is between about 5 and about 15; a ratio of the third active region width WA3 to the first active region width WA1 is between about 5 and about 15; a ratio of the third contact width WD3 to the first contact width WD1 is between about 5 and about 15; and a ratio of the third gate width WG3 to the first gate width WG1 is between about 5 and about 15.

Figure 8:
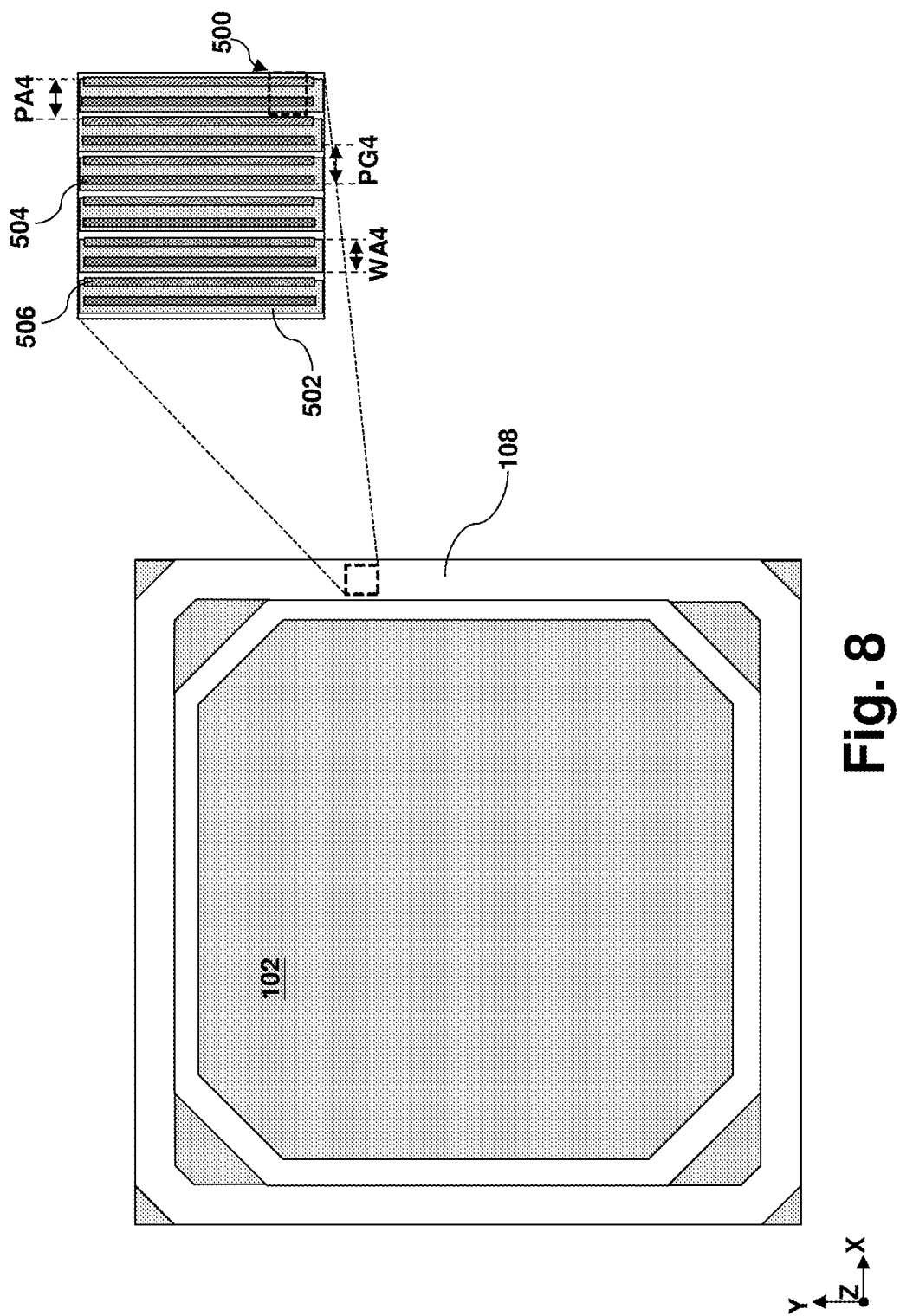
FIG. 8 illustrates an enlarged fragmentary top view of an outer ring of the IC chip in FIG. 1, according to one or more aspects of the present disclosure.

Reference is then made to FIG. 8, which includes an enlarged fragmentary top view of the outer ring 108. The outer ring 108 may include an array of fourth semiconductor devices 500. In some embodiments, the fourth semiconductor devices 500 in the outer ring 108 are electrically grounded and serve as grounding structures. In the embodiments represented in FIG. 8, the outer ring 108 includes third active regions 502 extending along a longitudinal direction of the outer ring 108, third gate structures 504 extending along a longitudinal direction of the outer ring 108, third source/drain contacts 506 along a longitudinal direction of the outer ring 108. As shown in FIG. 8, the third active regions 502, the third gate structures 504 and the third source/drain contacts 506 extend continuously around the inner ring 104 and the inner corner areas 106.

The third active regions 502 may include silicon (Si), germanium (Ge), silicon germanium (SiGe) or a combination thereof. When MBC transistors are desired for the device region 102, the segmented active regions 202 include channel members 208 that are released by selective removal of silicon germanium sacrificial layers. As will be described further below, because the third gate structures do not span completely across the third active region 502, both the silicon layers and the silicon germanium layers remain in the third active region 502. Each of the third gate structures 504 includes a gate dielectric layer and a gate electrode layer over the gate dielectric layer. While being different in shape and configuration, the third gate structures 504 and the segmented gate structures 204 have similar composition and are formed using the same processes. Therefore, a detailed description of the composition of the third gate structures 504 is omitted for brevity.

Each of the third sourced/drain contacts 506 may include a barrier layer, a silicide layer, and a metal filler layer disposed over the silicide layer. The barrier layer may include titanium nitride or tantalum nitride. The silicide layer may include titanium silicide, tantalum silicide, cobalt silicide, nickel silicide, or tungsten silicide. The silicide layer interfaces the source/drain features to reduce contact resistance. The metal fill layer may include ruthenium (Ru), copper (Cu), nickel (Ni), cobalt (Co), or tungsten (W). The source/drain features are formed by epitaxial deposition of semiconductor materials such as silicon (S) or silicon germanium (SiGe) and may be doped with an n-type dopant, such as phosphorus (P) or arsenic (As) or a p-type dopant, such as boron (B) or boron difluoride ($BF_2$).

Reference is still made to FIG. 8. The third active regions 502 are disposed at a fourth active region pitch PA4 along the width of the outer ring 108, which is along the X direction in the enlarged area. The third gate structures 504 are disposed at a fourth gate pitch PG4 along the length of the outer ring 108. In some embodiments, the fourth active region pitch PA4 may be between about 125 nm and about 400 nm and the fourth gate pitch PG4 may be between about 125 nm and about 400 nm. Each of the third active regions 502 has a fourth active region width WA4. In some instances, the fourth active region width WA4 may be between about 50 nm and about 300 nm.

Figure 9:
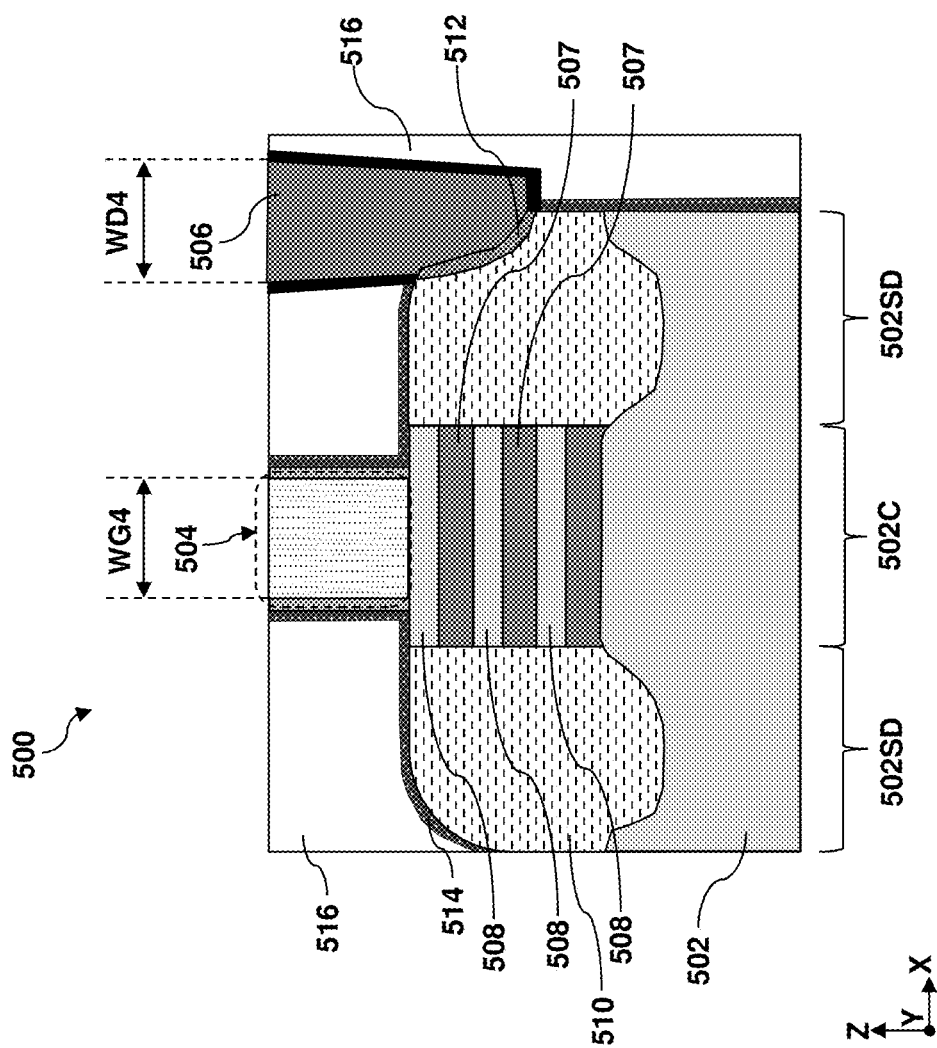
FIG. 9 illustrates a fragmentary cross-sectional view of a semiconductor device in the outer ring of the IC chip in FIG. 1, according to one or more aspects of the present disclosure.

Reference is now made to FIG. 9, which illustrates a fragmentary cross-sectional view of the fourth semiconductor device 500 in the outer ring 108. In the depicted embodiment, the fourth semiconductor device 500 includes some feature of an MBC transistor but is structurally more similar to a FinFET. Each of the third active regions 502 includes a channel region 502C disposed between two source/drain regions 502SD. In the channel region 502C, the third active region 502 includes a vertical stack of channel layers 508 that are interleaved by sacrificial layers 507. In some instances, the channel layers 508 include silicon and the sacrificial layers 507 include silicon germanium. Along the X direction, the channel layers 508 and sacrificial layers 507 extend between two source/drain features 510, each of which is disposed over a source/drain region 502SD. As described above, the source/drain features 510 may include silicon (Si) doped with an n-type dopant or silicon germanium (SiGe) doped with a p-type dopant. A third gate structure 504 is disposed over the channel region 502C but does not wrap around each of the channel layers 508 as the sacrificial layers 507 are not removed.

A contact etch stop layer (CESL) 514 is disposed over the source/drain features 510 and an interlayer dielectric (ILD) layer 516 over the CESL 514. A third source/drain contact 506 extends through the CESL 514 and the ILD layer 516 to come in contact with the source/drain feature 510. In some examples, the CESL 514 includes silicon nitride, silicon oxynitride, and/or other materials known in the art. The ILD layer 516 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The third source/drain contacts 506 extend through the ILD layer 516 and the CESL 514 to electrically couple to the source/drain features 510 by way of the silicide layer 512. As shown in FIG. 9, the third source/drain contact 506 has a fourth contact width WD4 along the X direction and the third gate structure 504 has a fourth gate width WG4 along the X direction. In some instances, the fourth contact width WD4 is between about 30 nm and about 100 nm and the fourth gate width WG4 is between about 50 nm and about 150 nm. In the depicted embodiments, the third source/drain contact 506 is disposed directly over an edge of the third active region 502 to maximize the spacing between the third source/drain contact 506 and the third gate structure 504.

The fourth semiconductor device 500 in the outer ring 108 is much larger than the first semiconductor devices 200 in the device region 102. For example, dimensions of the fourth semiconductor device 500 are about 5 times to about 15 times of those of the first semiconductor device 200. For example, a ratio of the fourth gate pitch PG4 to the first gate pitch PG1 is between about 5 and about 15; a ratio of the fourth active region pitch PA4 to the first active region pitch PA1 is between about 5 and about 15; a ratio of the fourth active region width WA4 to the first active region width WA1 is between about 5 and about 15; a ratio of the fourth contact width WD4 to the first contact width WD1 is between about 5 and about 15; and a ratio of the fourth gate width WG4 to the first gate width WG1 is between about 5 and about 15.

Figure 10:
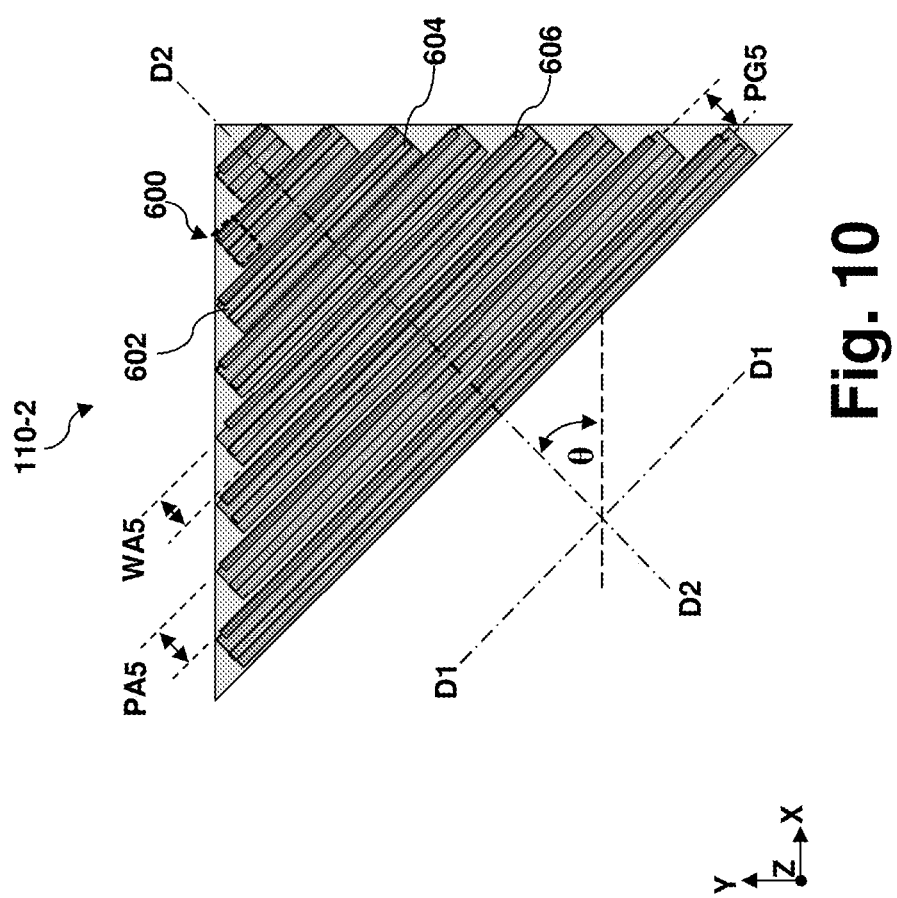
FIG. 10 illustrates an enlarged fragmentary top view of an outer corner area of the IC chip in FIG. 1, according to one or more aspects of the present disclosure.

Reference is then made to FIG. 10, which includes an enlarged fragmentary top view of an outer corner area 110. For illustration purposes, the second outer corner area 110-2 is shown in FIG. 10 but similar descriptions apply to the other three outer corner areas 110-1, 110-3 and 110-4. The second outer corner area 110-2 may include an array of fifth semiconductor devices 600. In some embodiments, the fifth semiconductor devices 600 in the outer corner areas 110 are electrically floating and serve as seal structures. That is, the fifth semiconductor devices 600 in the outer corner areas 110 function neither as transistors nor as grounding structures. In the embodiments represented in FIG. 10, the second outer corner area 110-2 includes fourth active regions 602 extending continuously along the first diagonal line D1 (which is perpendicular the second diagonal line D2), fourth gate structures 604 extending continuously along the first diagonal line D1, fourth source/drain contacts 606 continuously extending along the first diagonal line D1. As shown in FIG. 10, the fourth gate structures 604 and the fourth source/drain contacts 606 extend continuously from one edge of the second outer corner area 110-2 to the other edge. As shown in FIG. 10, the second outer corner area 110-2, like the other outer corner areas 110-1, 110-3 and 110-4, resembles a right triangle.

The fourth active regions 602 may include silicon (Si), germanium (Ge), silicon germanium (SiGe) or a combination thereof. When MBC transistors are desired for the device region 102, the segmented active regions 202 include channel members 208 that are released by selective removal of silicon germanium sacrificial layers. As will be described further below, because the fourth gate structures do not span completely across the fourth active region 602, both the silicon layers and the silicon germanium layers remain in the fourth active region 602. Each of the fourth gate structures 604 includes a gate dielectric layer and a gate electrode layer over the gate dielectric layer. While being different in shape and configuration, the fourth gate structures 604 and the segmented gate structures 204 have similar composition and are formed using the same processes. Therefore, a detailed description of the composition of the fourth gate structures 604 is omitted for brevity.

Each of the fourth sourced/drain contacts 606 may include a barrier layer, a silicide layer, and a metal filler layer disposed over the silicide layer. The barrier layer may include titanium nitride or tantalum nitride. The silicide layer may include titanium silicide, tantalum silicide, cobalt silicide, nickel silicide, or tungsten silicide. The silicide layer interfaces the source/drain features to reduce contact resistance. The metal fill layer may include ruthenium (Ru), copper (Cu), nickel (Ni), cobalt (Co), or tungsten (W). The source/drain features are formed by epitaxial deposition of semiconductor materials such as silicon (S) or silicon germanium (SiGe) and may be doped with an n-type dopant, such as phosphorus (P) or arsenic (As) or a p-type dopant, such as boron (B) or boron difluoride ($BF_2$).

Reference is still made to FIG. 10. The fourth active regions 602 are disposed at a fifth active region pitch PA5 along the second diagonal line D2. The fourth gate structures 604 are disposed at a fifth gate pitch PG5 along the second diagonal line D2. Each of the fourth gate structures 604 extends continuously from one edge of the second outer corner area 110-2 to another edge. Each of the fourth source/drain contacts 606 extends continuously from one edge of the second outer corner area 110-2 to another edge. In some embodiments, the fifth active region pitch PA5 may be between about 125 nm and about 400 nm and the fifth gate pitch PG5 may be between about 125 nm and about 400 nm. Each of the fourth active regions 602 has a fifth active region width WA5. In some instances, the fifth active region width WA5 may be between about 50 nm and about 300 nm.

Figure 11:
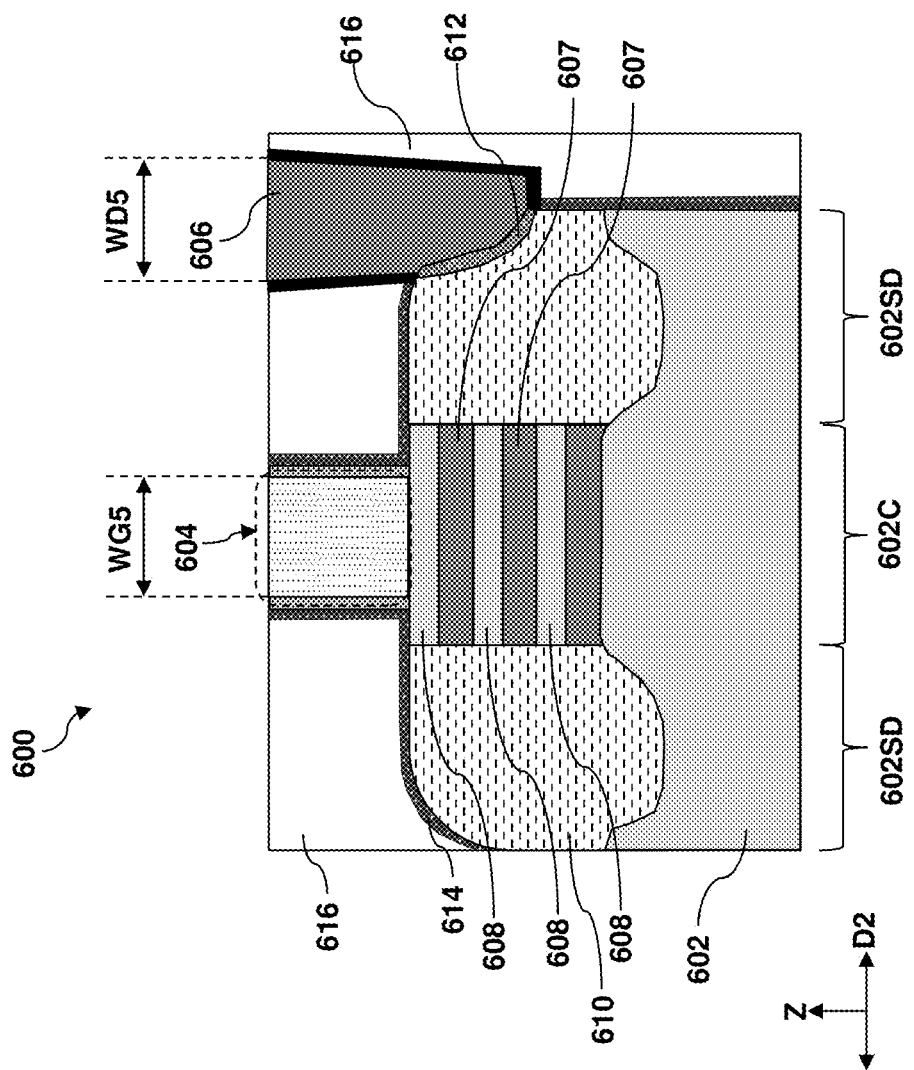
FIG. 11 illustrates a fragmentary cross-sectional view of a semiconductor device in the outer corner area of the IC chip in FIG. 1, according to one or more aspects of the present disclosure.

Reference is now made to FIG. 11, which illustrates a fragmentary cross-sectional view of the fifth semiconductor device 600 in the second outer corner area 110-2. In the depicted embodiment, the fifth semiconductor device 600 includes some feature of an MBC transistor but is structurally more similar to a FinFET. Each of the fourth active regions 602 includes a channel region 602C disposed between two source/drain regions 602SD. In the channel region 602C, the fourth active region 602 includes a vertical stack of channel layers 608 that are interleaved by sacrificial layers 607. In some instances, the channel layers 608 include silicon and the sacrificial layers 607 include silicon germanium. Along the second diagonal line D2, the channel layers 608 and sacrificial layers 607 extend between two source/drain features 610, each of which is disposed over a source/drain region 602SD. As described above, the source/drain features 610 may include silicon (Si) doped with an n-type dopant or silicon germanium (SiGe) doped with a p-type dopant. A fourth gate structure 604 is disposed over the channel region 602C but does not wrap around each of the channel layers 608 as the sacrificial layers 607 are not removed.

A contact etch stop layer (CESL) 614 is disposed over the source/drain features 610 and an interlayer dielectric (ILD) layer 616 over the CESL 614. A fourth source/drain contact 606 extends through the CESL 614 and the ILD layer 616 to come in contact with the source/drain feature 610. In some examples, the CESL 614 includes silicon nitride, silicon oxynitride, and/or other materials known in the art. The ILD layer 616 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The fourth source/drain contacts 606 extend through the ILD layer 616 and the CESL 614 to electrically couple to the source/drain features 610 by way of the silicide layer 612. As shown in FIG. 11, the fourth source/drain contact 606 has a fifth contact width WD5 along the second diagonal line D2 and the fourth gate structure 604 has a fifth gate width WG5 along the second diagonal line D2. In some instances, the fifth contact width WD5 is between about 30 nm and about 100 nm and the fifth gate width WG5 is between about 50 nm and about 150 nm. In the depicted embodiments, the fourth source/drain contact 606 is disposed directly over an edge of the fourth active region 602 to maximize the spacing between the fourth source/drain contact 606 and the fourth gate structure 604.

The fifth semiconductor device 600 in the second outer corner area 110-2 is much larger than the first semiconductor devices 200 in the device region 102. For example, dimensions of the fifth semiconductor device 600 are about 5 times to about 15 times of those of the first semiconductor device 200. For example, a ratio of the fifth gate pitch PG5 to the first gate pitch PG1 is between about 5 and about 15; a ratio of the fifth active region pitch PA5 to the first active region PA1 is between about 5 and about 15; a ratio of the fifth active region width WA5 to the first active region width WA1 is between about 5 and about 15; a ratio of the fifth contact width WD5 to the first contact width WD1 is between about 5 and about 15; and a ratio of the fifth gate width WG5 to the first gate width WG1 is between about 5 and about 15.

Figure 12:
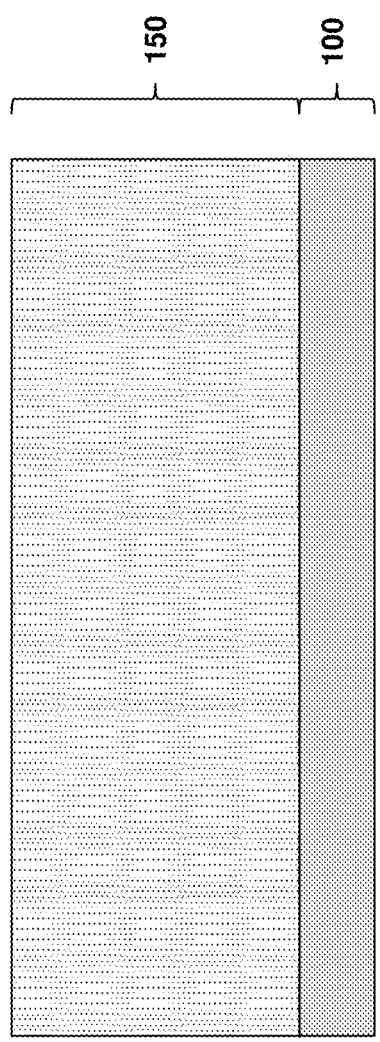
FIG. 12 illustrates a cross-sectional view of an interconnect structure disposed on the IC chip in FIG. 1, according to one or more aspects of the present disclosure.

FIG. 12 illustrates a cross-sectional view of an interconnect structure 150 disposed on the IC chip in FIG. 1. The interconnect structure 150 may include more than 9 metal line layers, such as between 10 metal layers and 14 metal layers. Each of the metal layers includes conductive lines embedded in an intermetal dielectric (IMD) layer. The interconnect structures 150 also includes contact vias to vertically interconnect conductive lines in different metal layers. The IMD layer may include materials such as tetraethylorthosilicate (TEOS) oxide, un-doped silicate glass, or doped silicon oxide, borophosphosilicate glass (BPSG), fused silica glass (FSG), phosphosilicate glass (PSG), boron doped silicon glass (BSG), silicon oxycarbide, and/or other suitable dielectric materials. The conductive lines and contact vias may include copper (Cu), titanium nitride (TiN), tungsten (W), or ruthenium (Ru).

Figure 13:
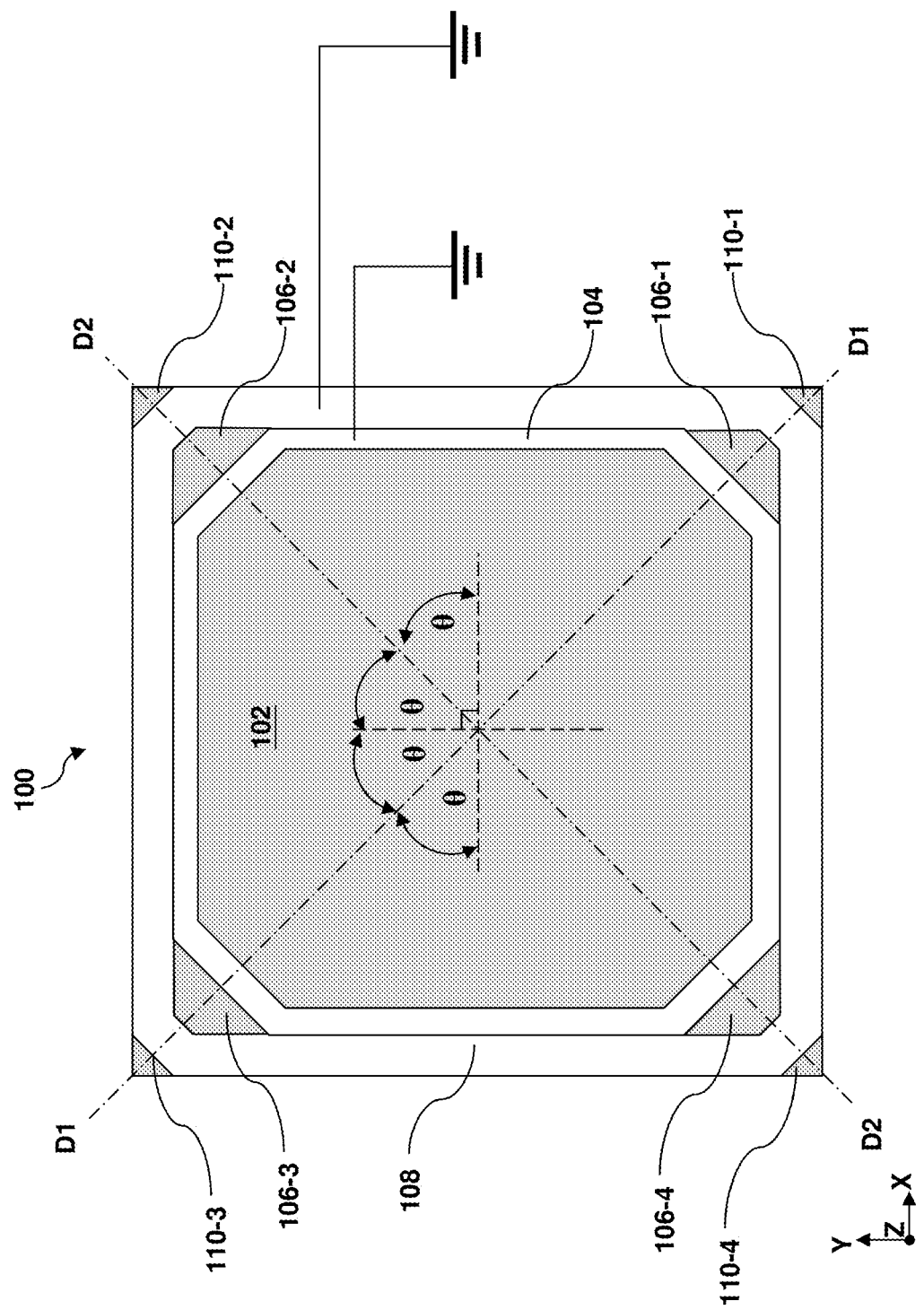
FIG. 13 is a schematic top view of the IC chip showing electrical connection to various areas and region of the IC chip, according to one or more aspects of the present disclosure.

Reference is now made to FIG. 13, which is a schematic top view of the IC chip 100 showing electrical connection to various areas and region therein. According to the present disclosure, the interconnect structure 150 shown in FIG. 12 provides different electrical interconnection to different regions and areas of the IC chip 100. With respect to the device region 102, the interconnect structure 150 interconnects the first semiconductor in the device region 102. With respect to the inner ring 104, the interconnect structure 150 connects the second semiconductor devices 300 in the inner ring 104 to an electrical ground. With respect to the inner corner areas 106, none of the conductive lines or contact vias in the interconnect structure 150 is connected to third semiconductor devices 400. With respect to the outer ring 108, the interconnect structure 150 connects the fourth semiconductor devices 500 in the outer ring 108 to the electrical ground. With respect to the outer corner areas 110, none of the conductive lines or contact vias in the interconnect structure 150 is connected to fifth semiconductor devices 600.

In one exemplary aspect, the present disclosure is directed to an integrated circuit (IC) chip. The IC chip includes a device region, an inner ring surrounding the device region, an outer ring surrounding the inner ring, a first corner area between an outer corner of the inner ring and an inner corner of the outer ring, and a second corner area disposed at an outer corner of the outer ring. The first corner area includes a first active region including a channel region and a source/drain region, a first gate structure over the channel region of the first active region, and a first source/drain contact over the source/drain region of the first active region. The first source/drain contact continuously extends from a first edge of the first corner area to a second edge of the first corner area.

In some embodiments, the first edge and the second edge of the first corner area form a 90-degree angle. In some implementations, the device region includes a second active region including a channel region and a source/drain region, a second gate structure over the channel region of the second active region, and a second source/drain contact over the source/drain region of the second active region. The first source/drain contact extends along a first direction and the second source/drain contact extends along a second direction. The first direction and the second direction form a 45-degree angle. In some instances, the first active region extends along the first direction, the second active region extends along a third direction perpendicular to the second direction, and the first direction and the third direction form a 45-degree angle. In some embodiments, the first active region includes a first width, the second active region includes a second width, and a ratio of the first width to the second width is between about 5 and about 15. In some embodiments, the first source/drain contact includes a third width, the second source/drain contact includes a fourth width, and a ratio of the third width to the fourth width is between about 5 and about 15. In some implementations, the inner ring includes a third active region including a channel region and a source/drain region, a third gate structure over the channel region of the third active region, and a third source/drain contact over the source/drain region of the third active region. The third source/drain contact extends around an entirety of the inner ring. In some embodiments, the outer ring includes a fourth active region including a channel region and a source/drain region, a fourth gate structure over the channel region of the fourth active region, and a fourth source/drain contact over the source/drain region of the fourth active region. The fourth source/drain contact extends around an entirety of the outer ring. In some embodiments, the second corner area includes a fifth active region including a channel region and a source/drain region, a fifth gate structure over the channel region of the fifth active region, and a fifth source/drain contact over the source/drain region of the fifth active region. The fifth source/drain contact continuously extends from a first edge of the second corner area to a second edge of the second corner area. In some instances, the first edge and the second edge of the second corner area form a 90-degree angle.

In another exemplary aspect, the present disclosure is directed to an IC chip. The IC chip includes a device region, an inner ring surrounding the device region, an outer ring surrounding the inner ring, and a first corner area between an outer corner of the inner ring and an inner corner of the outer ring. The first corner area includes a first active region including a channel region and a source/drain region, a first gate structure over the channel region of the first active region, and a first source/drain contact over the source/drain region of the first active region. The first source/drain contact continuously extends from a first edge of the first corner area to a second edge of the first corner area. The first edge and the second edge of the first corner area form a 90-degree angle.

In some embodiments, the first gate structure and the first source/drain contact are electrically floating. In some implementations, the device region includes a second active region having a channel region and a source/drain region, a second gate structure over the channel region of the second active region, and a second source/drain contact over the source/drain region of the second active region. The first source/drain contact extends along a first direction and the second source/drain contact extends along a second direction. The first direction and the second direction form a 45-degree angle. In some implementations, the inner ring includes a third active region including a channel region and a source/drain region, a third gate structure over the channel region of the third active region, and a third source/drain contact over the source/drain region of the third active region. The third source/drain contact extends around an entirety of the inner ring. In some instances, the third gate structure and the third source/drain contact are electrically grounded. In some implementations, the outer ring includes a fourth active region having a channel region and a source/drain region, a fourth gate structure over the channel region of the fourth active region, and a fourth source/drain contact over the source/drain region of the fourth active region. The fourth source/drain contact extends around an entirety of the outer ring. In some embodiments, the fourth gate structure and the fourth source/drain contact are electrically grounded.

In yet another exemplary aspect, the present disclosure is directed to an IC chip. The IC chip includes a device region, an inner ring surrounding the device region, an outer ring surrounding the inner ring a first corner area between an outer corner of the inner ring and an inner corner of the outer ring, the first corner area including a first plurality of source/drain contacts, and a second corner area disposed at an outer corner of the outer ring, the second corner area including a second plurality of source/drain contacts. The first plurality of source/drain contacts extend continuously from a first edge of the first corner area to a second edge of the first corner area. The second plurality of source/drain contacts extend continuously from a first edge of the second corner area to a second edge of the second corner area.

In some embodiments, the inner ring includes a third plurality of source/drain contacts and the third plurality of source/drain contacts extend continuously along an entirety of the inner ring. In some implementations, the outer ring includes a fourth plurality of source/drain contacts and the fourth plurality of source/drain contacts extend continuously along an entirety of the outer ring.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) chip, comprising:
   a device region;
   an inner ring surrounding the device region;
   an outer ring surrounding the inner ring;
   a first corner area between an outer corner of the inner ring and an inner corner of the outer ring, the first corner area comprising:
      a first active region comprising a channel region and a source/drain region,
      a first gate structure over the channel region of the first active region, and
      a first source/drain contact over the source/drain region of the first active region; and
   a second corner area disposed at an outer corner of the outer ring,
   wherein the first source/drain contact continuously extends from a first edge of the first corner area to a second edge of the first corner area.

2. The IC chip of claim 1, wherein the first edge and the second edge of the first corner area form a 90-degree angle.

3. The IC chip of claim 1, wherein the device region comprises:
   a second active region comprising a channel region and a source/drain region;
   a second gate structure over the channel region of the second active region; and
   a second source/drain contact over the source/drain region of the second active region,
   wherein the first source/drain contact extends along a first direction and the second source/drain contact extends along a second direction,
   wherein the first direction and the second direction form a 45-degree angle.

4. The IC chip of claim 3,
   wherein the first active region extends along the first direction,
   wherein the second active region extends along a third direction perpendicular to the second direction,
   wherein the first direction and the third direction form a 45-degree angle.

5. The IC chip of claim 3,
   wherein the first active region comprises a first width,
   wherein the second active region comprises a second width,
   wherein a ratio of the first width to the second width is between about 5 and about 15.

6. The IC chip of claim 3,
   wherein the first source/drain contact comprises a third width,
   wherein the second source/drain contact comprises a fourth width,
   wherein a ratio of the third width to the fourth width is between about 5 and about 15.

7. The IC chip of claim 1, wherein the inner ring comprises:
   a third active region comprising a channel region and a source/drain region;
   a third gate structure over the channel region of the third active region; and
   a third source/drain contact over the source/drain region of the third active region,
   wherein the third source/drain contact extends around an entirety of the inner ring.

8. The IC chip of claim 1, wherein the outer ring comprises:
- a fourth active region comprising a channel region and a source/drain region;
- a fourth gate structure over the channel region of the fourth active region; and
- a fourth source/drain contact over the source/drain region of the fourth active region,
- wherein the fourth source/drain contact extends around an entirety of the outer ring.

9. The IC chip of claim 1, wherein the second corner area comprises:
- a fifth active region comprising a channel region and a source/drain region;
- a fifth gate structure over the channel region of the fifth active region; and
- a fifth source/drain contact over the source/drain region of the fifth active region,
- wherein the fifth source/drain contact continuously extends from a first edge of the second corner area to a second edge of the second corner area.

10. The IC chip of claim 9, wherein the first edge and the second edge of the second corner area form a 90-degree angle.

11. An integrated circuit (IC) chip, comprising:
- a device region;
- an inner ring surrounding the device region;
- an outer ring surrounding the inner ring; and
- a first corner area between an outer corner of the inner ring and an inner corner of the outer ring, the first corner area comprising:
  - a first active region comprising a channel region and a source/drain region,
  - a first gate structure over the channel region of the first active region, and
  - a first source/drain contact over the source/drain region of the first active region,
- wherein the first source/drain contact continuously extends from a first edge of the first corner area to a second edge of the first corner area,
- wherein the first edge and the second edge of the first corner area form a 90-degree angle.

12. The IC chip of claim 11, wherein the first gate structure and the first source/drain contact are electrically floating.

13. The IC chip of claim 11, wherein the device region comprises:
- a second active region comprising a channel region and a source/drain region;
- a second gate structure over the channel region of the second active region; and
- a second source/drain contact over the source/drain region of the second active region,
- wherein the first source/drain contact extends along a first direction and the second source/drain contact extends along a second direction,
- wherein the first direction and the second direction form a 45-degree angle.

14. The IC chip of claim 13, wherein the inner ring comprises:
- a third active region comprising a channel region and a source/drain region;
- a third gate structure over the channel region of the third active region; and
- a third source/drain contact over the source/drain region of the third active region,
- wherein the third source/drain contact extends around an entirety of the inner ring.

15. The IC chip of claim 14, wherein the third gate structure and the third source/drain contact are electrically grounded.

16. The IC chip of claim 14, wherein the outer ring comprises:
- a fourth active region comprising a channel region and a source/drain region;
- a fourth gate structure over the channel region of the fourth active region; and
- a fourth source/drain contact over the source/drain region of the fourth active region,
- wherein the fourth source/drain contact extends around an entirety of the outer ring.

17. The IC chip of claim 16, wherein the fourth gate structure and the fourth source/drain contact are electrically grounded.

18. An integrated circuit (IC) chip, comprising:
- a device region;
- an inner ring surrounding the device region;
- an outer ring surrounding the inner ring;
- a first corner area between an outer corner of the inner ring and an inner corner of the outer ring, the first corner area comprising a first plurality of source/drain contacts; and
- a second corner area disposed at an outer corner of the outer ring, the second corner area comprising a second plurality of source/drain contacts,
- wherein the first plurality of source/drain contacts extend continuously from a first edge of the first corner area to a second edge of the first corner area,
- wherein the second plurality of source/drain contacts extend continuously from a first edge of the second corner area to a second edge of the second corner area.

19. The IC chip of claim 18,
- wherein the inner ring comprises a third plurality of source/drain contacts,
- wherein the third plurality of source/drain contacts extend continuously along an entirety of the inner ring.

20. The IC chip of claim 18,
- wherein the outer ring comprises a fourth plurality of source/drain contacts,
- wherein the fourth plurality of source/drain contacts extend continuously along an entirety of the outer ring.

* * * * *